United States Patent
Kim

(10) Patent No.: US 11,626,077 B2
(45) Date of Patent: Apr. 11, 2023

(54) SCAN DRIVER AND DISPLAY DEVICE INCLUDING THE SAME

(71) Applicant: Samsung Display Co., Ltd., Yongin-si (KR)

(72) Inventor: Jong Hee Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/582,978

(22) Filed: Jan. 24, 2022

(65) Prior Publication Data

US 2022/0148513 A1    May 12, 2022

Related U.S. Application Data

(62) Division of application No. 16/922,643, filed on Jul. 7, 2020, now Pat. No. 11,257,436.

(30) Foreign Application Priority Data

Aug. 26, 2019   (KR) .......................... 10-2019-0104474

(51) Int. Cl.
*G09G 3/3266*    (2016.01)
*G11C 19/28*    (2006.01)

(52) U.S. Cl.
CPC ........... *G09G 3/3266* (2013.01); *G11C 19/28* (2013.01); *G09G 2300/0809* (2013.01);
(Continued)

(58) Field of Classification Search
CPC ............... G09G 3/3266; G09G 3/3677; G09G 2300/0809; G09G 2300/0404;
(Continued)

(56) References Cited

U.S. PATENT DOCUMENTS 6,192,073 B1   2/2001  Reader et al.
6,952,363 B2  10/2005  Song et al.
(Continued)

FOREIGN PATENT DOCUMENTS

KR    10-0262453 B1    8/2000
KR    10-0532438 B1   11/2005
(Continued)

OTHER PUBLICATIONS

Kim, Kyung Min, et al.; "Bezel Free Design of Organic Light Emitting Diodes via a-InGaZnO Gate Driver Circuit Integration within Active Array"; SID2019; 5pp.

*Primary Examiner* — David Tung
(74) *Attorney, Agent, or Firm* — Lewis Roca Rothgerber Christie LLP

(57) ABSTRACT

Provided are a scan driver and a display device including the same. The scan driver includes a first power line configured to supply a first voltage signal, a second power line configured to supply a second voltage signal having a lower voltage level than the first voltage signal, a pull-up transistor configured to output a corresponding clock signal, among multiple clock signals, as a scan signal in response to a logic state of a first node, a pull-down transistor configured to output the second voltage signal from the second power line as the scan signal in response to a logic state of a second node, and a first light-blocking film overlapping the pull-up transistor or the pull-down transistor, and configured to receive the second voltage signal from the second power line and the first voltage signal from the first power line.

5 Claims, 11 Drawing Sheets

(52) U.S. Cl.
CPC . *G09G 2310/0286* (2013.01); *G09G 2310/08* (2013.01); *G09G 2330/028* (2013.01)

(58) Field of Classification Search
CPC ....... G09G 2310/08; G09G 2310/0264; G09G 2310/0286; G09G 2310/0281; G09G 2320/028; G09G 2320/0295; G09G 2230/00; G11C 19/28
See application file for complete search history.

(56) References Cited

U.S. PATENT DOCUMENTS

| | | | |
|---|---|---|---|
| 7,893,905 B2 | 2/2011 | Kim et al. | |
| 7,916,111 B2 | 3/2011 | Kim et al. | |
| 10,121,406 B2 | 11/2018 | Jang | |
| 2015/0187860 A1* | 7/2015 | Seo | H01L 27/3262 257/40 |
| 2016/0322116 A1* | 11/2016 | Jang | G09G 3/3266 |
| 2017/0032733 A1* | 2/2017 | Jang | H01L 29/78633 |
| 2020/0219451 A1 | 7/2020 | Kim | |
| 2020/0243018 A1 | 7/2020 | Kim et al. | |

FOREIGN PATENT DOCUMENTS

| | | |
|---|---|---|
| KR | 10-0769195 B1 | 10/2007 |
| KR | 10-1232163 B1 | 2/2013 |
| KR | 10-1243815 B1 | 3/2013 |
| KR | 10-1251377 B1 | 4/2013 |
| KR | 10-1308436 B1 | 9/2013 |
| KR | 10-2016-0025695 A | 3/2016 |
| KR | 10-2017-0014836 A | 2/2017 |
| KR | 10-2018-0003367 A | 1/2018 |
| KR | 10-1950844 B1 | 2/2019 |
| KR | 10-1992898 B1 | 6/2019 |
| KR | 10-2020-0085976 A | 7/2020 |
| KR | 10-2020-0094895 A | 8/2020 |

\* cited by examiner

SCAN DRIVER AND DISPLAY DEVICE INCLUDING THE SAME

CROSS-REFERENCE TO RELATED APPLICATIONS

This application is a divisional of U.S. patent application Ser. No. 16/922,643, filed Jul. 7, 2020, which claims priority to and the benefit of Korean Patent Application No. 10-2019-0104474, filed Aug. 26, 2019, the entire content of both of which is incorporated herein by reference.

BACKGROUND

1. Field

Various embodiments of the present disclosure relate to a scan driver and a display device including the scan driver.

2. Related Art

Recently, the importance of a display device has increased with the development of multimedia. Accordingly, flat-panel display devices, such as liquid crystal display devices, plasma display devices, organic light-emitting display devices, and the like, are widely used.

The scan driving circuit of such a flat-panel display device includes a shift register that is configured to sequentially supply a scan pulse to multiple scan lines. The shift register includes a plurality of stages, that include multiple transistors, and that sequentially output gate pulses by being coupled in a cascade manner.

These days, a gate-in-panel (GIP) structure, in which a transistor forming the shift register of a gate driving circuit takes the form of thin-film transistor and is embedded in the substrate of a display panel, is being applied in a liquid crystal display device and/or in an organic light-emitting display device.

Because the transistor that forms a shift register having a GIP structure serves to supply a gate pulse to the gate line of a display panel, durability, which guarantees a long service life and electrical reliability, is important. Other important factors include mobility, leakage current, and the like, which are the basic characteristics of the transistor.

Here, the semiconductor layer of the transistor is formed of amorphous silicon or polycrystalline silicon. The amorphous silicon has advantages of a simple film-forming process and low manufacturing cost, but is problematic in that electrical reliability is not ensured. Also, the polycrystalline silicon is problematic in that it is difficult to be used in a large-scale application due to high processing temperature, and due to the degree of uniformity not being ensured depending on a crystallization method. To solve these problems, research for using an oxide semiconductor as the semiconductor layer of a transistor is underway.

Meanwhile, a double-gate transistor may be used to configure a shift register, but it may cause a scan driver to erroneously operate because it is sensitive to the characteristic variation.

SUMMARY

Various embodiments of the present disclosure are directed to a scan driver that is capable of reducing erroneous operations even though a double-gate transistor is used.

Furthermore, various embodiments of the present disclosure are directed to a display device including the above-described scan driver.

Aspects of the present disclosure are not limited to the above, and other aspects, which might not be described here, may be clearly understood by those skilled in the art from the following description.

Embodiments of the present disclosure provide for a scan driver. The scan driver includes a first power line configured to supply a first voltage signal, a second power line configured to supply a second voltage signal having a lower voltage level than the first voltage signal, a pull-up transistor configured to output a corresponding clock signal, among multiple clock signals, as a scan signal in response to a logic state of a first node, a pull-down transistor configured to output the second voltage signal from the second power line as the scan signal in response to a logic state of a second node, and a first light-blocking film overlapping the pull-up transistor or the pull-down transistor, and configured to receive the second voltage signal from the second power line and the first voltage signal from the first power line.

The pull-up transistor may include a double-gate transistor.

A first gate electrode of the pull-up transistor may be coupled to the first node, and a second gate electrode thereof may be directly or capacitively coupled to the first light-blocking film.

The scan driver may further include a first coupling transistor configured to apply the first voltage signal from the first power line to the first light-blocking film in response to the logic state of the first node.

The first coupling transistor may be configured to apply the first voltage signal to the first light-blocking film only in a period during which the pull-up transistor outputs the corresponding clock signal as the scan signal.

The scan driver may further include a second coupling transistor configured to apply the second voltage signal from the second power line to the first light-blocking film in response to the logic state of the second node.

The scan driver may further include a second light-blocking film overlapping the pull-down transistor, and the first light-blocking film may overlap the pull-up transistor.

The scan driver may further include a third coupling transistor configured to apply the second voltage signal from the second power line to the second light-blocking film in response to the logic state of the first node, and a fourth coupling transistor configured to apply the first voltage signal from the first power line to the second light-blocking film in response to the logic state of the second node.

The scan driver may further include an inverter configured such that an input terminal thereof is coupled to the first node, an output terminal thereof is coupled to the second node, and a power terminal thereof is coupled to the first power line and the second power line.

The inverter may be configured to supply a logic state that is opposite to the logic state of the first node to the second node in response to control of the first node.

The scan driver may further include a start transistor configured to supply an output of a previous stage or a start pulse to the first node in response to the output of the previous stage or the start pulse.

The scan driver may further include a reset transistor configured to supply the second voltage signal from the second power line to the first node in response to an output of a following stage or a reset pulse.

The pull-down transistor may include a double-gate transistor, and a first gate electrode of the pull-down transistor may be coupled to the second node, and a second gate electrode thereof may be coupled or electrically coupled to the first light-blocking film.

The pull-up transistor may include an oxide transistor.

The first light-blocking film may overlap an oxide semiconductor layer of the pull-up transistor.

The first light-blocking film may maintain the first voltage signal during a first section and may maintain the second voltage signal during a second section.

A period during which the pull-up transistor outputs the corresponding clock signal as the scan signal may be included in the first section.

The first light-blocking film may overlap the pull-up transistor, wherein the pull-up transistor includes a first gate electrode located on the first light-blocking film, a source electrode and a drain electrode located on the first gate electrode, an oxide semiconductor layer located on the source electrode and the drain electrode, and a second gate electrode located on the oxide semiconductor layer, and wherein the first gate electrode is configured to receive a voltage signal from the first light-blocking film.

Other embodiments of the present disclosure provide for a scan driver. The scan driver includes a first power line configured to supply a first voltage signal, a second power line configured to supply a second voltage signal having a lower voltage level than the first voltage signal, a pull-up transistor configured to output a corresponding clock signal, among multiple clock signals, as a scan signal in response to a logic state of a first node, a pull-down transistor configured to output the second voltage signal from the second power line as the scan signal in response to a logic state of a second node, an inverter configured such that an input terminal thereof is coupled to the first node, an output terminal thereof is coupled to the second node, and a power terminal thereof is coupled to the first power line and the second power line, and a first light-blocking film overlapping the pull-up transistor or the pull-down transistor, and configured to receive the second voltage signal from the second power line and the corresponding clock signal.

Still other embodiments of the present disclosure provide for a display device. The display device includes a timing controller configured to generate a scan driving control signal and a data driving control signal based on externally supplied signals, a scan driver configured to output a scan signal to a scan line in response to the scan driving control signal, a data driver configured to output a data signal to a data line in response to the data driving control signal, and a display including a pixel coupled to the scan line and the data line, wherein the scan driver includes a first power line configured to supply a first voltage signal, a second power line configured to supply a second voltage signal having a lower voltage level than the first voltage signal, a pull-up transistor configured to output a corresponding clock signal, among multiple clock signals, as the scan signal in response to a logic state of a first node, a pull-down transistor configured to output the second voltage signal from the second power line as the scan signal in response to a logic state of a second node, a first light-blocking film overlapping the pull-up transistor or the pull-down transistor, a first coupling transistor configured to apply the first voltage signal from the first power line to the first light-blocking film in response to the logic state of the first node, and a second coupling transistor configured to apply the second voltage signal from the second power line to the first light-blocking film in response to the logic state of the second node, wherein the first light-blocking film is configured to receive the second voltage signal from the second power line and the first voltage signal from the first power line at different times, and wherein the pull-up transistor is configured to output the corresponding clock signal as the scan signal during a period included in a period during which the first voltage signal is applied to the first light-blocking film.

Other detailed matters of various embodiments are included in the detailed description and the drawings.

DETAILED DESCRIPTION

Figure 1:
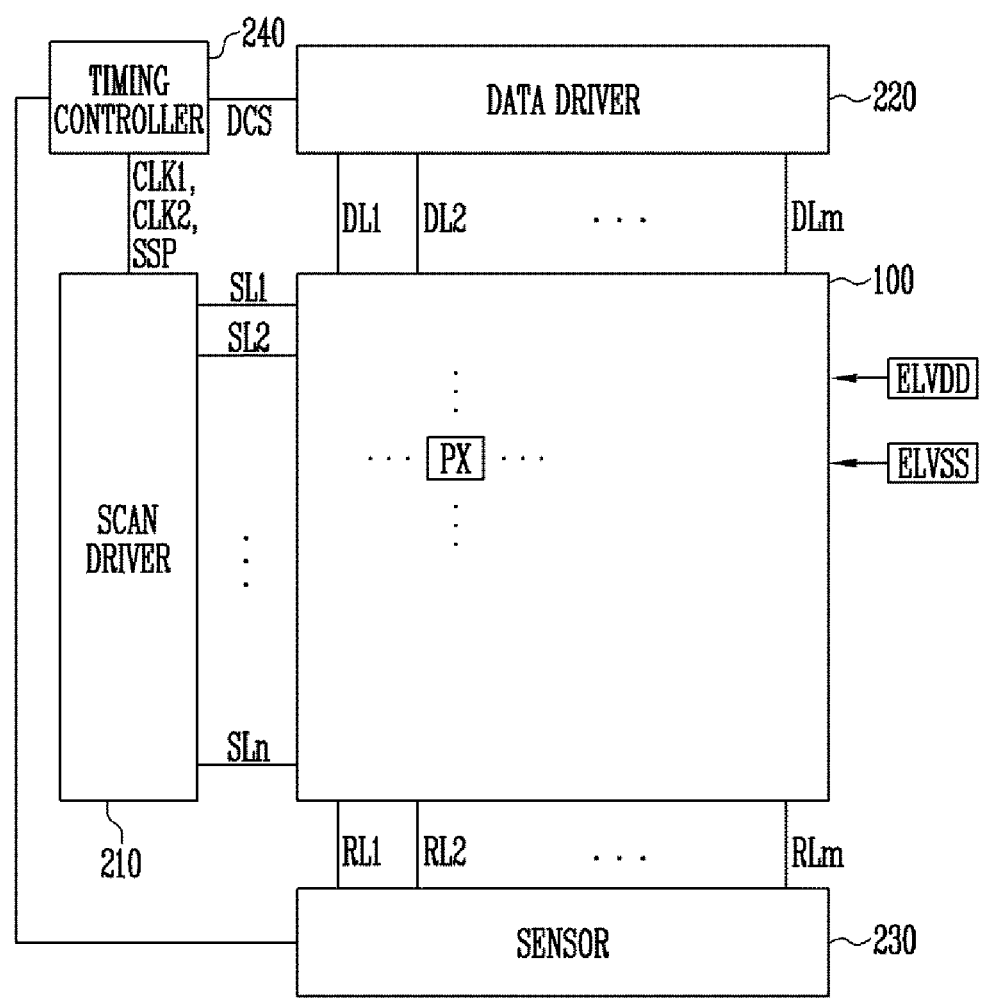
FIG. 1 is a block diagram illustrating a display device according to embodiments of the present disclosure.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described.

Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
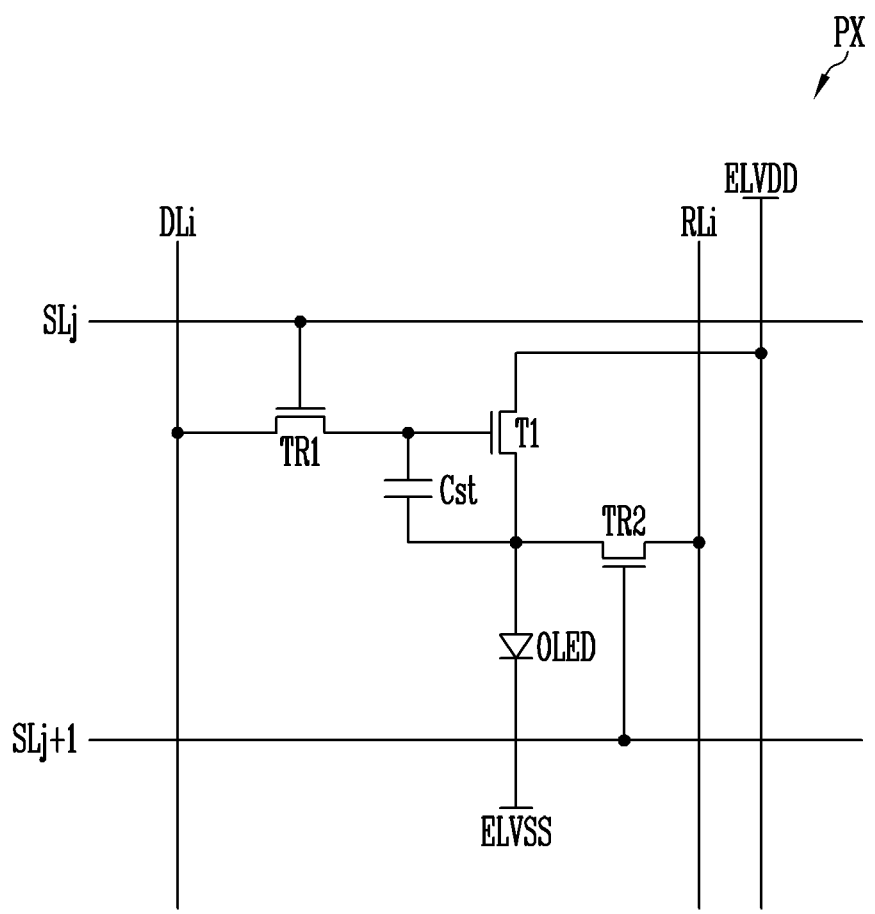
FIG. 2 is an equivalent circuit diagram for explaining one pixel of FIG. 1.

FIG. 1 is a block diagram illustrating a display device according to embodiments of the present disclosure. FIG. 2 is an equivalent circuit diagram for explaining one pixel illustrated in FIG. 1

Hereinafter, an organic light-emitting display device will be described as an example of a display device. However, without limitation thereto, the embodiments may be applied to other display devices, such as a liquid display device, a field emission display device, an electrophoretic device, and the like, unless it changes the technical spirit of the present disclosure.

Referring to FIG. 1 and FIG. 2, a display device according to embodiments of the present disclosure may include a display part 100 including multiple pixels PX, a scan driver 210, a data driver 220, a sensor 230, and a timing controller 240.

The timing controller 240 may generate a scan driving control signal and a data driving control signal DCS based on externally input signals. The scan driving control signal and the data driving control signal DCS generated by the timing controller 240 may be supplied to the scan driver 210 and the data driver 220, respectively.

The scan driving control signal may include multiple clock signals CLK1 and CLK2 and a scan start signal SSP. The scan start signal SSP may control the timing at which a first scan signal is output.

The data driving control signal DCS may include a source start pulse and clock signals. The source start pulse controls the time at which sampling of data is started, and the clock signals may be used to control a sampling operation.

The scan driver 210 may output scan signals to scan lines SL1 to SLn in response to the scan driving control signal. The scan driver 210 may sequentially supply the scan signals to the scan lines SL1 to SLn. Here, the scan signal may be set to a scan-on voltage (e.g., a high-level voltage) to turn on transistors included in the pixels PX.

The data driver 220 may output a data signal to data lines DL1 to DLm in response to the data driving control signal DCS. The data signal supplied to the data lines DL1 to DLm may be supplied to the pixels PX to which the scan signal is supplied. To this end, the data driver 220 may supply the data signal to the data lines DL1 to DLm so as to be synchronized with the scan signal.

The sensor 230 may supply an initialization voltage to the pixels to which sensing signals are supplied through sensing lines RL1 to RLm, and may measure the degradation information of the pixels. Although the sensor 230 is illustrated as a separate component in FIG. 1, the sensor 230 may be included in the data driver 220.

The display part 100 may include multiple pixels PX, each being coupled to one data line DLi of the data lines DL1 to DLm, one scan line SLj of the scan lines SL1 to SLn, and one sensing line RLi of the sensing lines RL1 to RLm.

The pixels PX may be supplied with a first voltage signal ELVDD, which is a high-potential voltage, and a second voltage signal ELVSS, which is a low-potential voltage, that are externally supplied.

Each of the pixels PX is individually driven by multiple thin-film transistors. An amorphous silicon (a-Si) transistor, a polysilicon (poly-Si) transistor, an oxide transistor, an organic transistor, or the like may be used as the thin-film transistor. Here, an example in which an oxide transistor is used as the thin-film transistor will be described in the present disclosure.

In an embodiment, each of the pixels PX may include a pixel circuit, including an organic light-emitting element OLED coupled between a first power line, in which the first voltage signal ELVDD flows, and a second power line, in which the second voltage signal ELVSS flows, and may also include first and second switching transistors ST1 and ST2, a driving transistor T1, and a storage capacitor Cst, which are configured to individually drive the organic light-emitting element OLED.

The organic light-emitting element OLED includes an anode coupled to the driving transistor T1, a cathode coupled to the second power line, and a light-emitting element layer located between the anode and the cathode, thereby being configured to emit light in proportion to the amount of current supplied from the driving transistor T1.

The first switching transistor ST1 supplies a data voltage from a corresponding data line DLi to the scan node of the driving transistor T1 by being driven in response to a scan signal from one scan line SLj, and the second switching transistor ST2 supplies an initialization voltage from the sensing line RLi to the source node of the driving transistor T1 by being driven in response to a scan signal from another scan line SLj+1. The second switching transistor ST2 may be used as the path through which current from the driving transistor T1 is output to the sensing line RLi in a sensing mode.

The storage capacitor Cst, which is coupled between the scan node and source node of the driving transistor T1, is charged with a differential voltage between the data voltage, which is supplied to the scan node through the first switching transistor ST1, and the initialization voltage, which is supplied to the source node through the second switching transistor ST2, and supplies the charged voltage as the driving voltage of the driving transistor T1.

The driving transistor T1 controls the current supplied from the first power line depending on the driving voltage supplied from the storage capacitor Cst, and supplies the current, the amount of which being proportional to the driving voltage, to the organic light-emitting element OLED, thereby enabling the organic light-emitting element OLED to emit light.

Meanwhile, in an embodiment, the scan driving circuit forming the scan driver 210 may be a Gate-in-Panel (GIP) type, and may be formed of oxide transistors formed on a substrate along with the transistors of the pixels.

The scan driver 210 includes a shift register for individually driving the scan lines SL1 to SLn coupled to the display part 100 in a sequential or interlaced manner in response to the scan driving control signal from the timing controller 240. The scan driver 210 enables each of the scan line SL1 to SLn by supplying a scan pulse having a scan-on voltage during the driving period of the corresponding scan line, and disables the corresponding scan line by supplying a scan-off voltage during the remaining period. The scan driving circuit may be formed on one side of the border area of the display part 100, or may be a plurality formed on opposite sides of the border area of the display part 100.

Figure 3:
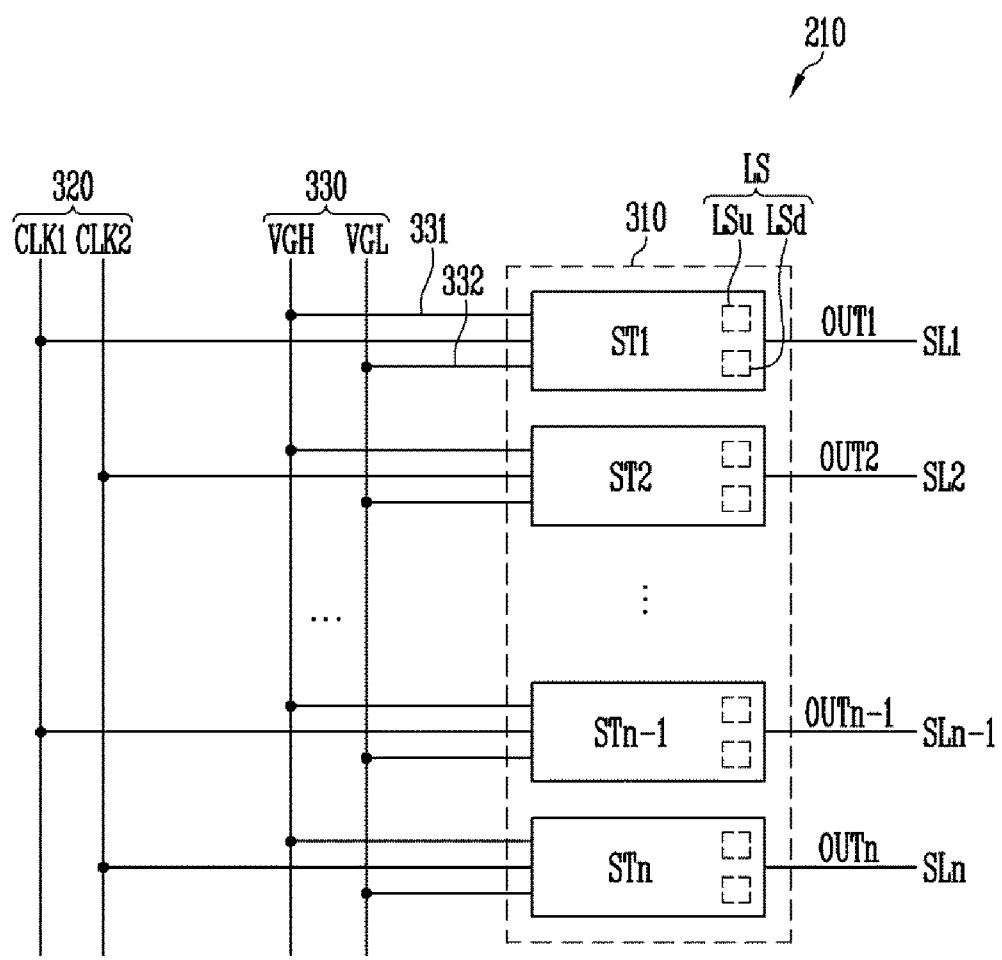
FIG. 3 is a diagram illustrating a scan driving circuit of the scan driver of FIG. 1.

FIG. 3 is a diagram illustrating the scan driving circuit of the scan driver of FIG. 1.

Referring to FIG. 3, a scan driver according to embodiments of the present disclosure includes a shift register 310, a clock line component 320, a power line component 330, and a light-blocking layer LS.

The shift register 310 includes multiple stages ST1 to STn respectively coupled to the multiple scan lines SL1 to SLn in a one-to-one manner. The respective output terminals OUT1 to OUTn of the multiple stages ST1 to STn may be coupled to the respective scan lines SL1 to SLn in a one-to-one manner.

Each of the multiple stages ST1 to STn may be enabled in response to a signal output from one of the previous stages or in response to a scan start signal, and may be reset in response to a signal output from one of the following stages or in responds to a reset pulse. To this end, each of the multiple stages ST1 to STn includes multiple oxide transistors, each including an oxide semiconductor layer. Here, the oxide semiconductor layer may be formed of zinc oxide (ZnO), indium zinc oxide (InZnO), indium gallium zinc oxide (InGaZnO$_4$), or the like.

The shift register 310 includes the light-blocking layer LS configured to absorb external light and internal light by overlapping the oxide semiconductor layer of the transistor, thereby reducing or preventing photodegradation of the oxide transistor. Particularly, each of the stages ST1 to STn of the shift register 310 further includes a coupling transistor configured to apply a different voltage signal for each section to the light-blocking layer LS, which overlaps the output transistor, thereby reducing a clock load caused by the light-blocking layer LS, and thereby also reducing or preventing voltage emission. Accordingly, the output characteristics of the stage may be improved. Also, the light-blocking layer LS of each stage is divided into multiple sections and multiple regions, and different voltages are applied thereto, whereby the characteristics of the transistor may be adjusted for each region depending on the role of the transistor.

The clock line component 320 includes multiple clock signal lines through which multiple clock signals CLK1 and CLK2, the phases of which are sequentially delayed, are supplied from the timing controller 240 illustrated in FIG. 1. The multiple clock signal lines are selectively coupled to each of the multiple stages ST1 to STn, thereby supplying at least one of the clock signals CLK1 and CLK2 to each of the multiple stages ST1 to STn. In the present embodiment, the clock line component 320 is described as including a first clock signal line, through which the first clock signal CLK1 is supplied, and a second clock signal line, through which the second clock signal CLK2 is supplied, but other embodiments are not limited to the number of clock signal lines.

The power line component 330 includes a high-potential third power line 331, through which a high-potential third voltage signal VGH having a gate-on voltage level of the transistors in each of the stages ST1 to STn is supplied, and also includes a low-potential fourth power line 332, through which a low-potential fourth voltage signal VGL having a gate-off voltage level of the transistors in each of the stages ST1 to STn is supplied. Each of the third power line 331 and the fourth power line 332 is coupled in common to the multiple stages ST1 to STn. According to some embodiments, the third voltage signal VGH may have the same voltage level as the first voltage signal ELVDD, and the fourth voltage signal VGL may have the same voltage level as the second voltage signal ELVSS, but they are not limited thereto.

The light-blocking layer LS overlaps at least one of the multiple thin-film transistors. In an embodiment, the light-blocking layer LS may include a pull-up light-blocking film LSu, which overlaps a pull-up transistor, and a pull-down light-blocking film LSd, which overlaps a pull-down transistor. A description thereof will be described later. In an embodiment, the pull-down light-blocking film LSd may be omitted.

The light-blocking layer LS overlaps the pull-up transistor, which outputs a clock signal as a gate pulse, among the multiple transistors, thereby reducing or preventing degradation of the oxide semiconductor layer of the pull-up transistor due to light.

The light-blocking layer LS may maintain a different voltage level for each section. The light-blocking layer LS according to an example is coupled to a high-potential power line, a low-potential power line, a clock line, the source electrode of the pull-up transistor, or the output node of the stages ST1 to STn, thereby receiving a voltage signal having the corresponding voltage level.

In some embodiments, the respective light-blocking layers LS provided in the multiple stages ST1 to STn may be coupled together through a coupling line and a bridge electrode.

Figure 4:
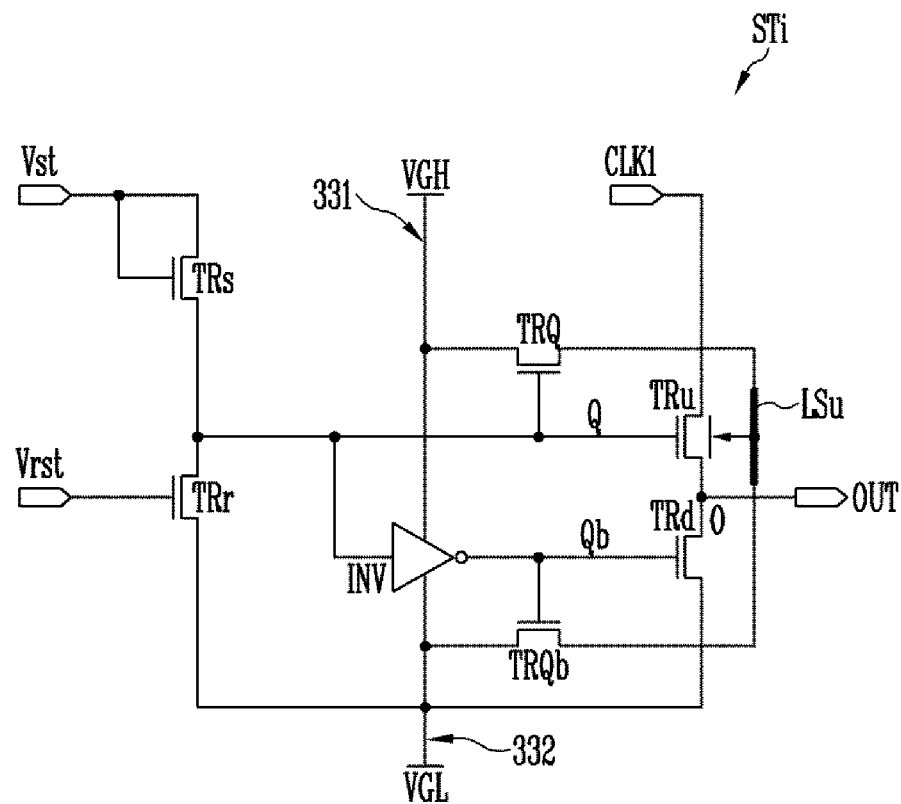
FIG. 4 is a circuit diagram illustrating one stage of the scan driver according to the example of FIG. 3.
Figure 5:
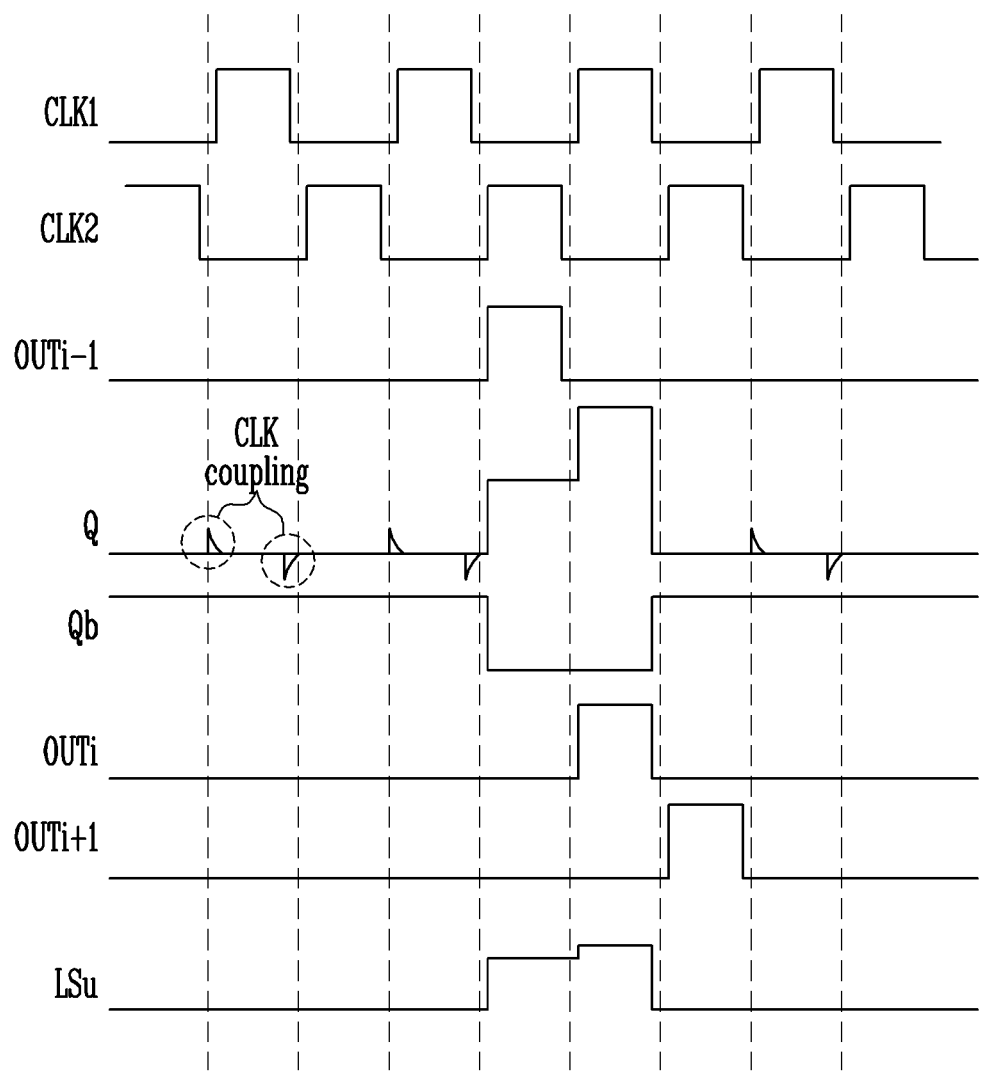
FIG. 5 is a timing diagram illustrating the waveform of a voltage signal applied to some nodes of one stage of FIG. 4.
Figure 6:
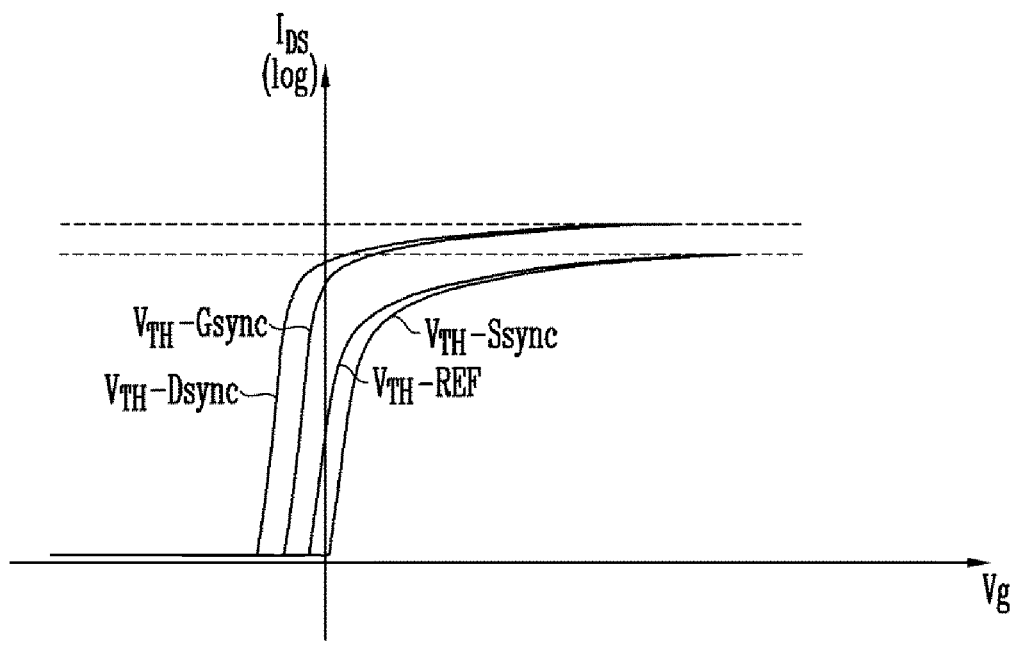
FIG. 6 is a graph of a driving current versus a threshold voltage, which indicates the variable threshold voltage characteristic of an oxide transistor.

FIG. 4 is a circuit diagram illustrating one stage of the scan driver according to the example of FIG. 3. FIG. 5 is a timing diagram illustrating the waveform of a voltage signal applied to some nodes of one stage of FIG. 4. FIG. 6 is a graph of a driving current versus a threshold voltage, which indicates the variable threshold voltage characteristic of an oxide transistor.

Referring to FIG. 4 and FIG. 6, one stage STi of the scan driver may include a start transistor TRs controlled by a start signal Vst, a reset transistor TRr controlled by a reset signal Vrst, a pull-up transistor TRu and a pull-down transistor TRd of an output terminal OUT, an inverter INV, a first coupling transistor TRQ, and a second coupling transistor TRQb.

The stage structure illustrated in FIG. 4 is schematic, and components, excluding the pull-up transistor TRu, the pull-down transistor TRd, the first coupling transistor TRQ, and the second coupling transistor TRQb, may be implemented in various known forms in the stage. For example, the reset signal Vrst may be replaced with a carry signal, and the inverter INV may be implemented in any of various known circuits.

The start transistor TRs controlled by the start signal Vst supplies a signal output from the previous stage or a scan start signal to a first node Q in response to the signal output from the previous stage or the scan start signal, thereby setting the first node Q to a high logic state.

The first node Q may be configured such that the source/drain electrode of the start transistor TRs, the source/drain electrode of the reset transistor TRr, the input terminal of the inverter INV, the gate electrode of the pull-up transistor TRu, and the gate electrode of the first coupling transistor TRQ are coupled thereto.

The reset transistor TRr controlled by the reset signal Vrst supplies a fourth voltage signal VGL to the first node Q in response to the output of the following stage or a reset pulse, thereby resetting the first node Q to a low logic state.

The pull-up transistor TRu, which is coupled to an output node O, outputs a corresponding clock signal (e.g., a first clock signal CLK1) to the output terminal OUT, which is coupled to the output node O, in response to the high logic state of the first node Q.

The output node O may be configured such that the source/drain electrode of the pull-up transistor TRu and the source/drain electrode of the pull-down transistor TRd are coupled thereto. The output node O may output a scan signal through the output terminal OUT.

In an embodiment, the pull-up transistor TRu may be a double-gate transistor. The double-gate transistor may be formed by locating two gate electrodes on opposite sides (e.g., the top side and the bottom side) of the semiconductor layer. In the case of the double-gate transistor, the mobility of driving current may be increased by increasing the number of gate electrodes. When the pull-up transistor TRu is formed of a double-gate transistor, the difference between the mobility of the pull-up transistor TRu and that of the pull-down transistor TRd may be compensated.

The first gate of the pull-up transistor TRu may be coupled to the first node Q, and the second gate thereof may receive a voltage signal from a pull-up light-blocking film LSu. According to some embodiments, the second gate of the pull-up transistor TRu may be directly coupled to the pull-up light-blocking film LSu, or may be insulated and capacitively coupled thereto.

The inverter INV is configured such that the input terminal thereof is coupled to the first node Q, the output terminal thereof is coupled to a second node Qb, and the power terminal thereof is supplied with the third voltage signal VGH and the fourth voltage signal VGL by being coupled to the third power line 331 and the fourth power line 332. The inverter INV supplies the third voltage signal VGH or the fourth voltage signal VGL to the second node Qb in response to the control of the first node Q such that the logic state of the second node Qb is opposite to the logic state of the first node Q. That is, the inverter INV supplies the fourth voltage signal VGL to the second node Qb when the first node Q is in a high logic state, and supplies the third voltage signal VGH to the second node Qb when the first node Q is in a low logic state.

The pull-down transistor TRd coupled to the output node O outputs the fourth voltage signal VGL to the output terminal OUT coupled to the output node O in response to the high logic state of the second node Qb, the logic state of the second node Qb being opposite to the logic state of the first node Q.

The voltage signal supplied to the output terminal OUT, the voltage signal applied by the reset transistor TRr, and the voltage signal supplied to the inverter INV may be the same fourth voltage signal VGL.

The first coupling transistor TRQ may apply the third voltage signal VGH to the pull-up light-blocking film LSu in response to the high logic state of the first node Q. The pull-up light-blocking film LSu may transmit the third voltage signal VGH to the second gate electrode of the pull-up transistor TRu.

In some embodiments, the first coupling transistor TRQ may apply a high-logic voltage to the pull-up light-blocking film LSu only in a first clock signal (CLK1) output period during which the pull-up transistor TRu outputs a high-logic scan signal, and may block the voltage applied to the pull-up light-blocking film LSu in the remaining period. In the period during which the first coupling transistor TRQ blocks the voltage applied to the pull-up light-blocking film LSu, another voltage signal (e.g., the fourth voltage signal VGL) may be applied to the pull-up light-blocking film LSu.

When a high-logic voltage is applied to the pull-up light-blocking film LSu, the pull-up transistor TRu may obtain a high driving current in a manner that is similar to that of a gate-synchronization (sync) or drain-sync structure. Accordingly, the extent of the pull-up transistor TRu may be reduced. Also, the dead space in the scan driver may be reduced by the reduced size of the pull-up transistor TRu.

When the oxide transistor becomes similar to the gate-sync or drain-sync structure, the graph of the driving current $I_{DS}$ versus the gate voltage Vg (e.g., $V_{TH}$-Gsync or $V_{TH}$-Dsync in FIG. 6) may have a sharper slope than a reference graph $V_{TH}$-REF, and may be shifted to the left based thereon, as illustrated in FIG. 6. That is, when the oxide transistor becomes similar to the gate-sync or drain-sync structure, the mobility of the driving current Ids may increase, and the threshold voltage may be lowered. Also, the amount of driving current Ids may increase.

Conversely, when the oxide transistor becomes similar to a source-sync structure, the graph of the driving current $I_{DS}$ versus the gate voltage Vg (e.g., $V_{TH}$-Ssync in FIG. 6) may be shifted to the right based on the reference graph $V_{TH}$-REF. That is, when the oxide transistor becomes similar to the source-sync structure, the threshold voltage may be raised.

The second coupling transistor TRQb may apply the fourth voltage signal VGL to the pull-up light-blocking film LSu in response to the high logic state of the second node Qb. Here, the first node Q may have a low-logic voltage. Accordingly, the pull-up light-blocking film LSu may transmit the fourth voltage signal VGL to the second gate electrode of the pull-up transistor TRu.

In this case, the fourth voltage signal VGL is applied to the both gate electrodes of the pull-up transistor TRu, which is a double-gate transistor, whereby an effect similar to the effect of the source-sync structure may be obtained.

In the case of the double-gate transistor, the risk of malfunction caused by noise occurring in the same node may increase, as compared to a single-gate transistor. For example, the noise may include coupling noise by a clock signal (e.g., CLK coupling), as illustrated in FIG. 5.

In a period during which the first clock signal CLK is output from the pull-up transistor TRu, the pull-up transistor TRu, which is an oxide transistor, is configured to be similar to a gate-sync or drain-sync structure, and is configured to have a high driving current $I_{DS}$, whereby acceleration of the malfunction caused by the double-gate transistor structure may be compensated for.

Figure 7:
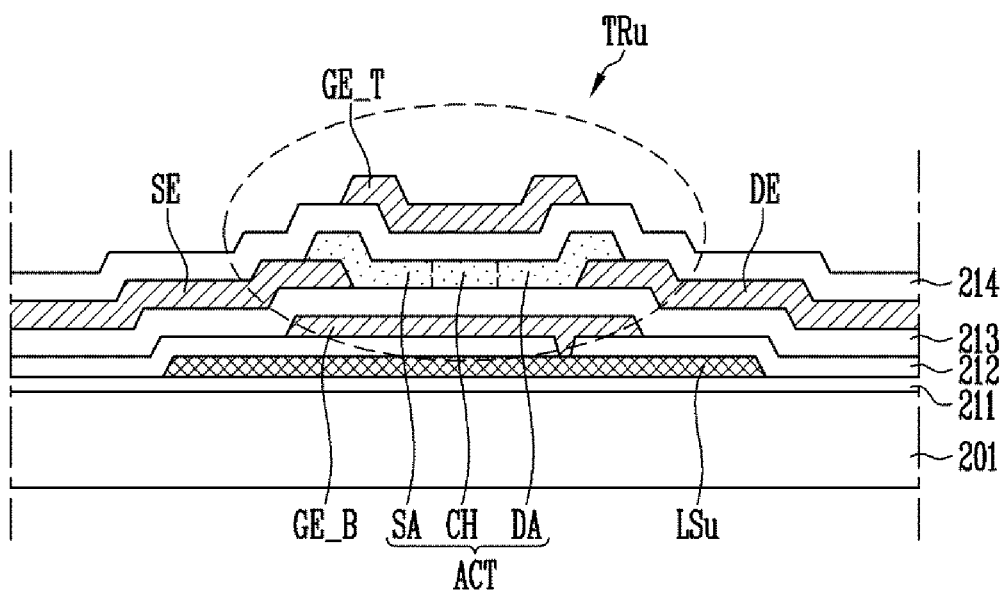
FIG. 7 is a cross-sectional view schematically illustrating a structure including the pull-up transistor and the pull-up light-blocking film illustrated in FIG. 4.
Figure 8:
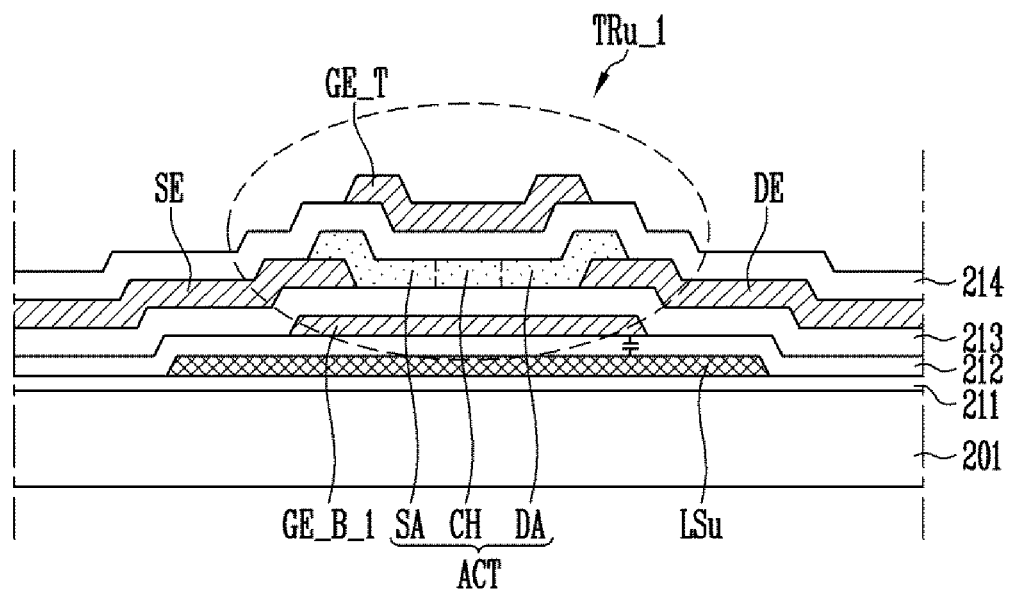
FIG. 8 is a cross-sectional view illustrating variation of the example of FIG. 7.

FIG. 7 is a cross-sectional view schematically illustrating a structure including the pull-up transistor and the pull-up light-blocking film of FIG. 4. FIG. 8 is a cross-sectional view illustrating the variation of the structure illustrated in FIG. 7.

Referring to FIG. 7, the scan driver may include a substrate 201, a pull-up light-blocking film LSu located on the substrate 201, and a pull-up transistor TRu located on the pull-up light-blocking film LSu to overlap the same.

The substrate 201 may be a rigid or flexible substrate. Here, when the substrate 201 is a rigid substrate, it may be any one of a glass substrate, a quartz substrate, a glass ceramic substrate, and a crystalline glass substrate. When the substrate 201 is a flexible substrate, it may be any one of a film substrate including a polymer organic material and a plastic substrate. Also, the substrate 201 may include fiber glass reinforced plastic (FRP). The substrate 201 may function as a base substrate.

A buffer layer 211 may be located on the substrate 201. The buffer layer 211 functions to flatten the surface of the substrate 201, and to reduce or prevent moisture or external air from permeating. The buffer layer 211 may be an inorganic film. The buffer layer 211 may be a single-layer film or a multi-layer film.

A light-blocking layer may be located on the buffer layer 211. In the drawing, the pull-up light-blocking film LSu, which is one component of the light-blocking layer, is illustrated.

The pull-up light-blocking film LSu reduces or prevents the leaking current and degradation of the pull-up transistor TRu, which are otherwise caused by light, by blocking light incident from the outside of the substrate 201 to an oxide semiconductor layer ACT of the pull-up transistor TRu, thereby improving the stability of the output of the pull-up transistor TRu. To this end, the pull-up light-blocking film LSu may have a larger size (or extent) than the oxide semiconductor layer ACT.

The light-blocking layer may be formed of an opaque metallic material having conductivity, a semiconductor material, or a light-absorbing material. For example, any semiconductor material, among silicon (Si), germanium (Ge), and silicon-germanium (SiGe), which are dielectric materials, each having electrical conductivity and a light absorption coefficient, may be used for the light-blocking layer. When a semiconductor is used, it includes a semiconductor material including germanium (Ge), which has a high light-blocking rate, whereby external light or internal light incident to the oxide semiconductor layer ACT may be blocked.

For example, the pull-up light-blocking film LSu may be formed by including amorphous silicon (a-Si). Generally, amorphous silicon (a-Si) is used to transform solar photovoltaic energy into electrical energy because it has a high light-absorption rate, and the light-absorption rate of amorphous silicon (a-Si) is about 100 times higher than the light-absorption rate of crystalline silicon. Such a pull-up light-blocking film LSu blocks light incident to the oxide semiconductor layer ACT of the pull-up transistor TRu, thereby reducing or preventing the leakage current and degradation of the pull-up transistor TRu, which are caused by light, and thereby improving the stability of the output of the pull-up transistor TRu.

A first insulation layer 212 may be located on the light-blocking layer. The first insulation layer 212 may be an inorganic film. The first insulation layer 212 may be a single-layer film or a multi-layer film.

A first conductive layer may be located on the first insulation layer 212. The first conductive layer may be patterned, thereby forming the bottom gate electrode GE_B of the pull-up transistor TRu. The bottom gate electrode GE_B may correspond to the above-described second gate electrode of the pull-up transistor TRu. The first conductive layer may include at least one of molybdenum (Mo), aluminum (Al), copper (Cu), and titanium (Ti). The first conductive layer may be a single-layer film or a multi-layer film.

In an embodiment, a contact hole is formed on the first insulation layer 212, and the bottom gate electrode GE_B may be coupled to the light-blocking layer (e.g. the pull-up light-blocking film LSu) through the contact hole.

A second insulation layer 213 may be located on the first conductive layer. The second insulation layer 213 may be an inorganic film. The second insulation layer 213 may be a single-layer film or a multi-layer film.

A second conductive layer may be located on the second insulation layer 213. The second conductive layer may be patterned, thereby forming the source electrode SE and the drain electrode DE of the pull-up transistor. The second conductive layer may include at least one of molybdenum (Mo), aluminum (Al), copper (Cu), and titanium (Ti).

A semiconductor layer may be located on the second conductive layer. The semiconductor layer may correspond to the above-described oxide semiconductor layer ACT of the pull-up transistor TRu.

The semiconductor layer may be located on a channel region CH, and may include a source region SA and a drain region DA, which are doped with impurities, on opposite sides of the channel region CH. The source region SA is coupled to the above-described source electrode SE of the pull-up transistor TRu, and the drain region DA may be coupled to the above-described drain electrode DE of the pull-up transistor TRu.

In other embodiments, an insulation layer may be further included between the second conductive layer and the semiconductor layer.

A third insulation layer 214 may be located on the semiconductor layer. The third insulation layer 214 may function to protect the oxide semiconductor layer ACT, the source electrode SE, and the drain electrode DE of the pull-up transistor TRu from the outside. The third insulation layer 214 may be an inorganic film and/or an organic film. The third insulation layer 214 may be a single-layer film or a multi-layer film.

A third conductive layer may be located on the third insulation layer 214. The third conductive layer may be patterned, thereby forming the top gate electrode GE_T of the pull-up transistor TRu. The top gate electrode GE_T may correspond to the above-described first gate electrode of the pull-up transistor TRu. The third conductive layer may include at least one of molybdenum (Mo), aluminum (Al), copper (Cu), and titanium (Ti). The third conductive layer may be a single-layer film or a multi-layer film.

Referring to FIG. 8, the bottom gate electrode GE_B_1 of the pull-up transistor TRu_1 and the pull-up light-blocking film LSu may be located to be insulated from each other, unlike in the example shown in FIG. 7. In this case, capacitance is formed between the bottom gate electrode GE_B_1 of the pull-up transistor TRu_1 and the pull-up light-blocking film LSu, whereby the bottom gate electrode GE_B_1 of the pull-up transistor TRu_1 and the pull-up light-blocking film LSu may be capacitively coupled to each other.

A scan driver according to embodiments will be described below.

Hereinafter, a repeated description of the same components in FIGS. 1 to 7 will be omitted, and the same or similar reference numeral will be used therefor.

Figure 9:
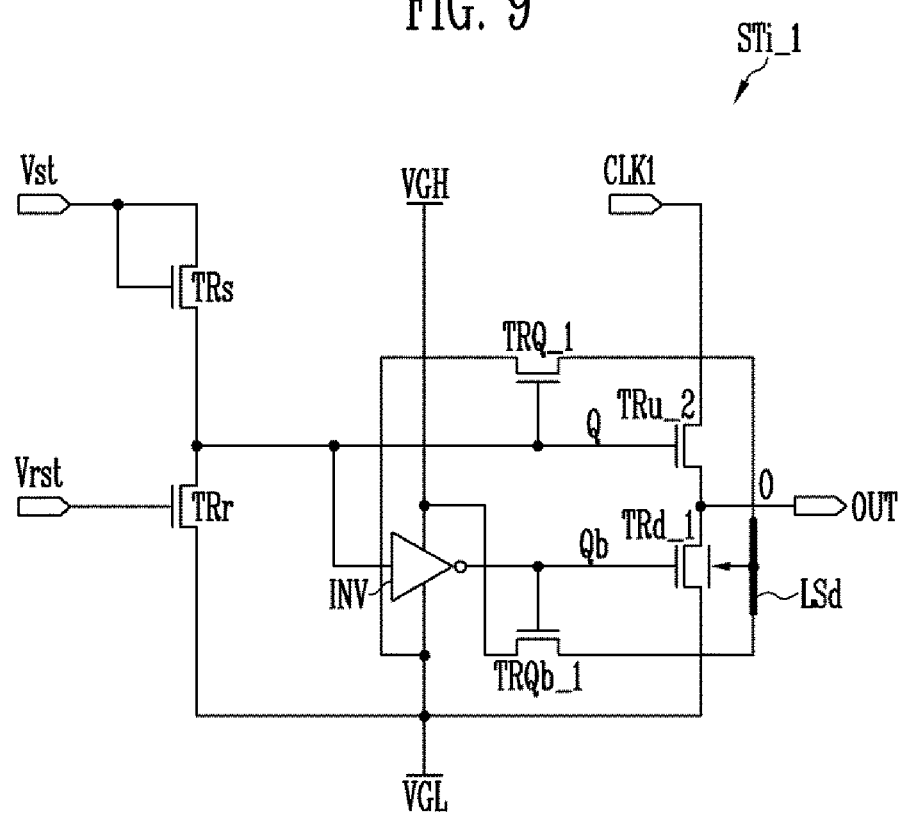
FIG. 9 is a circuit diagram illustrating one stage of a scan driver according to some embodiments.
Figure 10:
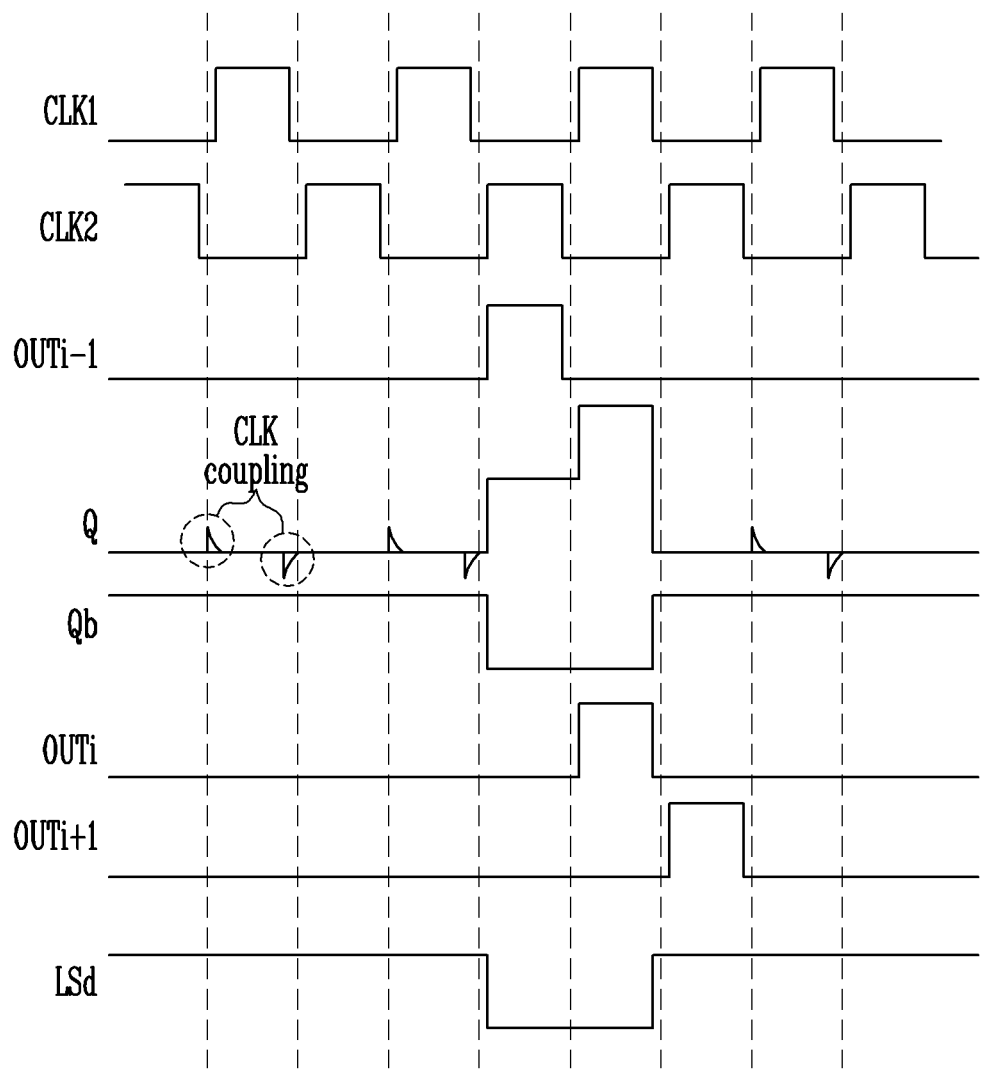
FIG. 10 is a timing diagram illustrating the waveform of a voltage signal applied to some nodes of one stage of FIG. 9.

FIG. 9 is a circuit diagram illustrating one stage of a scan driver according to some embodiments. FIG. 10 is a timing diagram illustrating the waveform of a voltage signal applied to some nodes of one stage of FIG. 9.

Referring to FIG. 9 and FIG. 10, one stage STi_1 of the scan driver according to the present example is different from one stage STi of the embodiments corresponding to FIG. 4 and FIG. 5 in that a pull-down transistor TRd_1 is a double-gate transistor, the second gate of the pull-down transistor TRd_1 is capable of receiving a voltage signal from a pull-down light-blocking film LSd, and a third coupling transistor TRQ_1 and a fourth coupling transistor TRQb_1 replace the first coupling transistor TRQ and the second coupling transistor TRQb, respectively.

Accordingly, in some embodiments, the pull-down transistor TRd_1 may be a double-gate transistor.

The first gate of the pull-down transistor TRd_1 may be coupled to the second node Qb, and the second gate thereof may receive a voltage signal from the pull-down light-blocking film LSd. The second gate of the pull-down transistor TRd_1 may overlap the pull-down light-blocking film LSd. According to some embodiments, the second gate of the pull-down transistor TRd_1 and the pull-down light-blocking film LSd may be directly coupled to each other, or may be insulated and capacitively coupled to each other.

The third coupling transistor TRQ_1 may apply the fourth voltage signal VGL to the pull-down light-blocking film LSd in response to the high logic state of the first node Q. The pull-down light-blocking film LSd may transmit the fourth voltage signal VGL to the second gate electrode of the pull-down transistor TRd_1.

In some embodiments, the third coupling transistor TRQ_1 applies a low-logic voltage to the pull-down light-blocking film LSd only in a first clock signal (CLK1) output period during which the pull-up transistor TRu_2 outputs a high-logic scan signal, and may block the voltage applied to the pull-down light-blocking film LSd in the remaining period. In a period during which the third coupling transistor TRQ_1 blocks the voltage applied to the pull-down light-blocking film LSd, another voltage signal (e.g., the third voltage signal VGH) may be applied to the pull-down light-blocking film LSd.

When a low-logic voltage is applied to the pull-down light-blocking film LSd, the threshold voltage of the pull-down transistor TRd_1 may vary similarly to the threshold voltage in a source-sync structure.

The fourth coupling transistor TRQb_1 may apply the third voltage signal
VGH to the pull-down light-blocking film LSd in response to the low logic state of the second node Qb. The pull-down light-blocking film LSd may transmit the third voltage signal VGH to the second gate electrode of the pull-down transistor TRd_1.

In this case, the third voltage signal VGH is applied to the gate electrode of the pull-down transistor TRd_1, which is a double-gate transistor, whereby an effect similar to the effect of the source-sync structure may be obtained.

Figure 11:
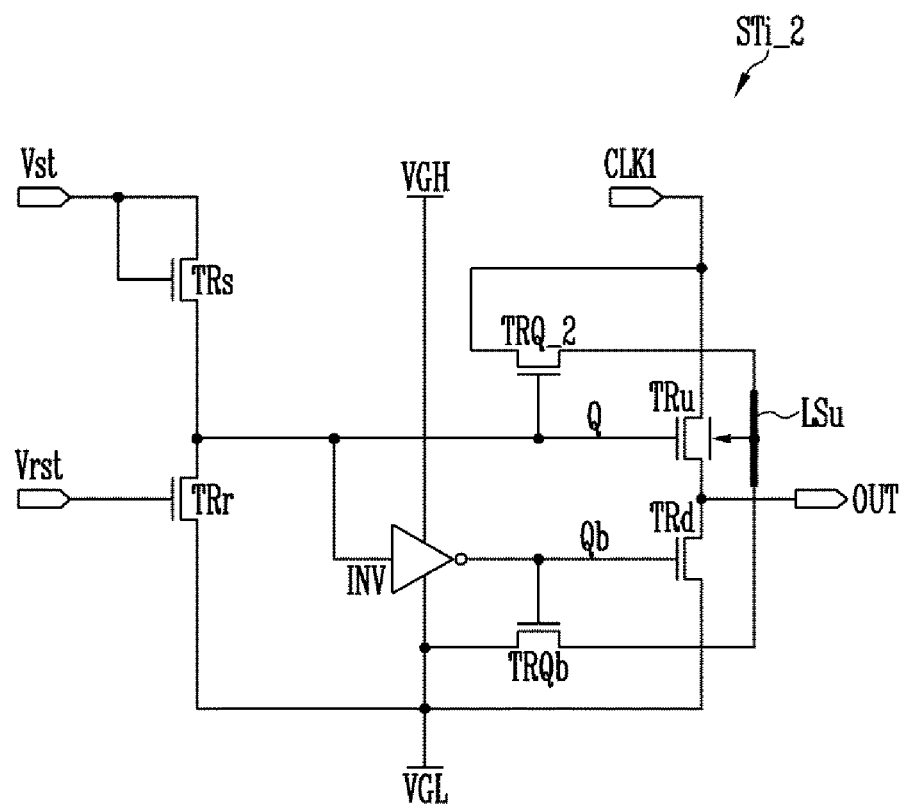
FIG. 11 is a circuit diagram illustrating one stage of a scan driver according to some embodiments.

FIG. 11 is a circuit diagram illustrating one stage of a scan driver according to some embodiments.

Referring to FIG. 11, one stage STi_2 of the scan driver according to the present example is different from one stage STi illustrated in FIG. 4 in that a first coupling transistor TRQ_2 transmits a first clock signal CLK1 to a pull-up light-blocking film LSu.

The first coupling transistor TRQ_2 may apply the first clock signal CLK1 to the pull-up light-blocking film LSu in response to the high logic state of the first node Q. The pull-up light-blocking film LSu may transmit the first clock signal CLK1 to the second gate electrode of the pull-up transistor TRu.

When embodiments are configured such that the first coupling transistor TRQ_2 applies a high-potential voltage signal having a gate-on voltage level to the pull-up light-blocking film LSu in response to the high logic state of the first node Q, the present disclosure may be applied regardless of the type of voltage signal applied to the pull-up light-blocking film LSu.

Figure 12:
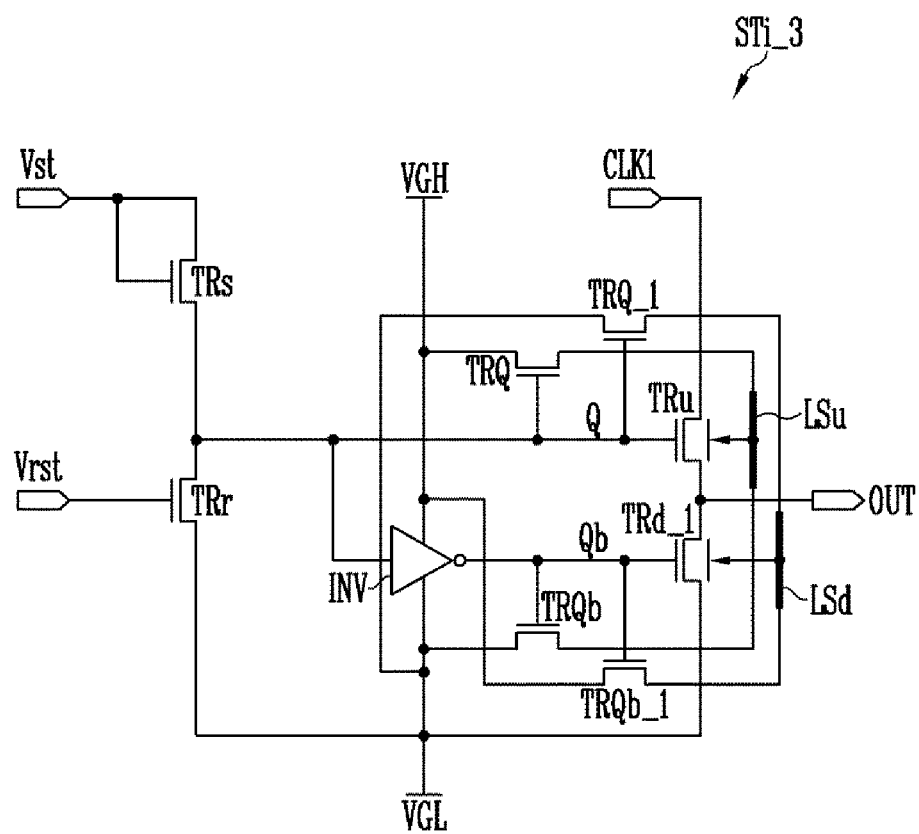
FIG. 12 is a circuit diagram illustrating one stage of a scan driver according to some embodiments.
Figure 13:
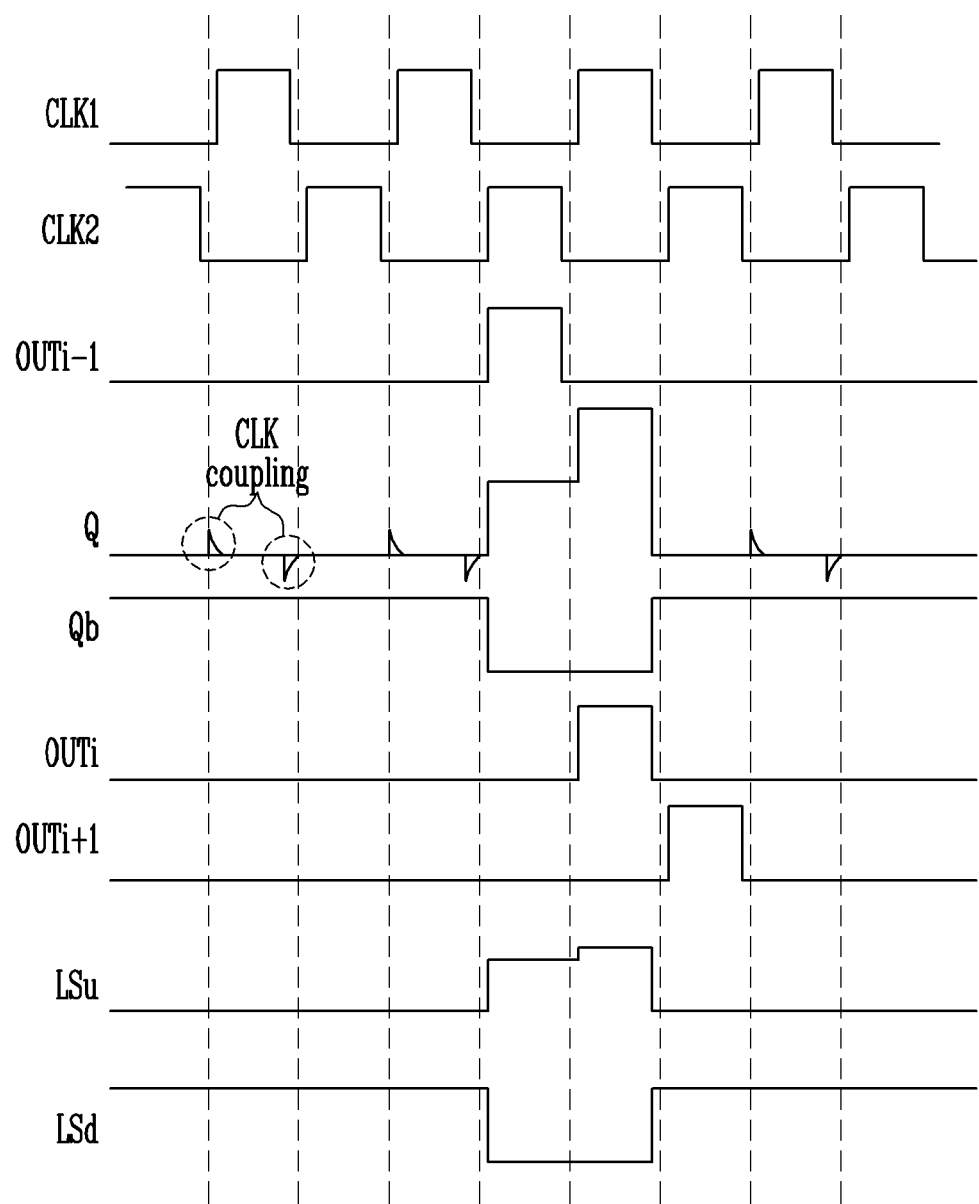
FIG. 13 is a timing diagram illustrating the waveform of a voltage signal applied to some nodes of one stage of FIG. 12.

FIG. 12 is a circuit diagram illustrating one stage of a scan driver according to some embodiments. FIG. 13 is a timing diagram illustrating the waveform of a voltage signal applied to some nodes of one stage of FIG. 12.

Referring to FIG. 12 and FIG. 13, one stage STi_3 of the scan driver according to the present example is different from one stage STi corresponding to FIG. 4 and FIG. 5 in that the pull-down transistor TRd_1 is a double-gate transistor, and in that a third coupling transistor TRQ_1 and a fourth coupling transistor TRQb_1, each being coupled to the pull-down light-blocking film LSd, are further included.

The present example may correspond to the example of FIG. 4 and FIG. 5 being combined with the example of FIG. 9 and FIG. 10.

Only in a first clock signal (CLK1) output period during which the pull-up transistor TRu outputs a high-logic scan signal, the first coupling transistor TRQ may apply a high-logic voltage to the pull-up light-blocking film LSu, and the third coupling transistor TRQ_1 may apply a low-logic voltage to the pull-down light-blocking film LSd. In the remaining period, the first coupling transistor TRQ may block the voltage applied to the pull-up light-blocking film LSu, and the third coupling transistor TRQ_1 may block the voltage applied to the pull-down light-blocking film LSd.

According to embodiments of the present disclosure, a scan driver may provide fast and stable output.

Also, high driving current may be obtained in a scan driver, and a dead space may be reduced by reducing the size of a transistor.

Aspects obtainable from embodiments are not limited by the above-mentioned aspects, and various aspects are included in this description.

While embodiments of the present disclosure have been described in detail with reference to the drawings, it will be understood by those skilled in the art that the present disclosure can be implemented in other specific forms without changing the technical spirit or essential features of the present disclosure. Therefore, it should be noted that the forgoing embodiments are merely illustrative in all aspects and are not to be construed as limiting the present disclosure.

What is claimed is:
1. A scan driver, comprising:
   a first power line configured to supply a first voltage signal;
   a second power line configured to supply a second voltage signal having a lower voltage level than the first voltage signal;
   a pull-up transistor configured to output a corresponding clock signal, among multiple clock signals, as a scan signal in response to a logic state of a first node;
   a pull-down transistor configured to output the second voltage signal from the second power line as the scan signal in response to a logic state of a second node;
   an inverter configured such that an input terminal thereof is coupled to the first node, an output terminal thereof is coupled to the second node, and a power terminal thereof is coupled to the first power line and the second power line;

a first light-blocking film overlapping the pull-up transistor or the pull-down transistor, and configured to receive the second voltage signal from the second power line and the corresponding clock signal; and a first coupling transistor coupled to a clock signal line to apply the corresponding clock signal from the clock signal line to the first light-blocking film in response to the logic state of the first node; and a second coupling transistor configured to apply the second voltage signal from the second power line to the first light-blocking film in response to the logic state of the second node.

2. The scan driver of claim 1, wherein the pull-up transistor comprises a double-gate transistor.

3. The scan driver of claim 1, wherein the pull-up transistor comprises a first gate electrode coupled to the first node, and a second gate electrode directly or capacitively coupled to the first light-blocking film.

4. The scan driver of claim 1, wherein the pull-down transistor comprises a double-gate transistor.

5. The scan driver of claim 1, wherein the pull-down transistor comprises a first gate electrode coupled to the second node, and a second gate electrode directly or capacitively coupled to the first light-blocking film.

* * * * *